May 13, 1958 WEN YUAN PAN ET AL 2,834,948

FREQUENCY SELECTIVE CIRCUIT STRUCTURES

Filed Nov. 1, 1954 2 Sheets-Sheet 1

INVENTORS.
Wen Yuan Pan &
David J. Carlson

BY H. C. Newton

ATTORNEY.

FREQUENCY SELECTIVE CIRCUIT STRUCTURES

Filed Nov. 1, 1954

2 Sheets-Sheet 2

INVENTORS.
Wen Yuan Pan &
David J. Carlson
BY H. C. Newton
ATTORNEY.

Patented May 13, 1958

2,834,948

FREQUENCY SELECTIVE CIRCUIT STRUCTURES

Wen Yuan Pan and David J. Carlson, Haddon Heights, N. J., assignors to Radio Corporation of America, a corporation of Delaware Application November 1, 1954, Serial No. 466,033

6 Claims. (Cl. 333—82)

This invention relates to frequency selective circuit structures for signal translating systems and more particularly to ultra high-frequency tuners of the resonant transmission line type which are tunable over a wide range of ultra high-frequencies.

The usual tuned circuit employing resonant transmission lines is either of the balanced type such as a Lecher wire line or of the unbalanced type such as a concentric line, and resonates at either ¼ wave length or ½ wave length of the desired operating frequency. The tuning member for the transmission line is generally a sliding contact member which provides substantially a short circuit connection across the conductors thereof, or circuit connections to the conductors, at varying distances from one end of the line depending on whether the operation is ¼ wave or ½ wave respectively. The resonant transmission line and the sliding contact member are relatively movable and in most commercial embodiments, the movable member is made rotatable. Unbalance currents in the resonant line must flow through an electric circuit which is necessarily completed through a conductive bearing of the rotatable member. Such a circuit path is highly unreliable and in some cases improvement is attempted by the provision of wiping contacts of one form or another.

In general, the wiping contacts are a source of erratic operation because of the addition of unknown impedances at high-frequencies. Among the other more serious effects of the wiping contact members are the introduction of contact resistance, noises and spurious response characteristics. Furthermore, since the contact resistance is in series with the resonant transmission line it tends to reduce the Q of the tuned circuits used in a tuner and thus adversely affect the operation thereof. The Q is a figure of merit which may be defined as the ratio of the energy stored to the energy dissipated.

Accordingly, it is a primary object of this invention to provide an improved ultra high-frequency tuning structure of the resonant transmission line type operable over a wide range of ultra high-frequencies in which the effects of wiping contacts or the like are minimized.

It is a further object of this invention to provide an improved high-frequency tuning structure of the resonant transmission line type which is continuously tunable over a wide range of high-frequencies and is characterized by its low insertion loss and high Q resulting thereby providing a high degree of stability and reliability in operation.

In accordance with the invention, a movable ground plane is provided in close proximity to the tuner chassis or ground, to provide a predetermined low capacitive reactance between the ground plane and the chassis.

The tuner includes a resonant transmission line section and a tuning element therefor which are mounted for relative movement. The movable portion of the tuner is conductively connected with the ground plane in a predetermined manner, and unbalance currents flowing in the transmission line are conveyed through the low capacitive reactance path, between the ground plane and the chassis.

In a specific embodiment of the invention directed to an unbalanced line structure, a transmission line conductor of arcuate configuration is positioned in a plane parallel to and closely adjacent the rotatable ground plane. The proximity of the conductor to the ground plane provides a low characteristic impedance line, and thus the relative effects of surrounding objects in the chassis on the resonant line are minimized. The circulating currents of the line are thus conveyed through the relatively low capacitive reactance provided between the rotatable ground plane and the tuner chassis. The tuning element may comprise a capacitive contact element insulatingly mounted on tuner chassis providing an output connection for the tuner, thereby effectively eliminating the effects of sliding contact elements entirely.

Accordingly, it is another object of this invention to provide an improved high-frequency tuning structure of the resonant transmission line type, in which the Q for the tuner is improved. In a preferred embodiment, this is accomplished by the provision of a ground plane which is closely positioned adjacent to the tuner chassis and electrostatically coupled thereto.

A further object of this invention is to provide an improved high-frequency tuning structure of the resonant transmission line type having a low impedance path to ground for high-frequency signals through a movable ground plane closely capacitively coupled to said system ground.

A still further object of this invention is to provide an improved transmission line structure wherein the transmission line is mounted in close proximity to and for movement with a movable ground plane electrostatically with system ground thereby enabling a reduction in the effects of surrounding objects on the line.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which:

Figures 1, 2:
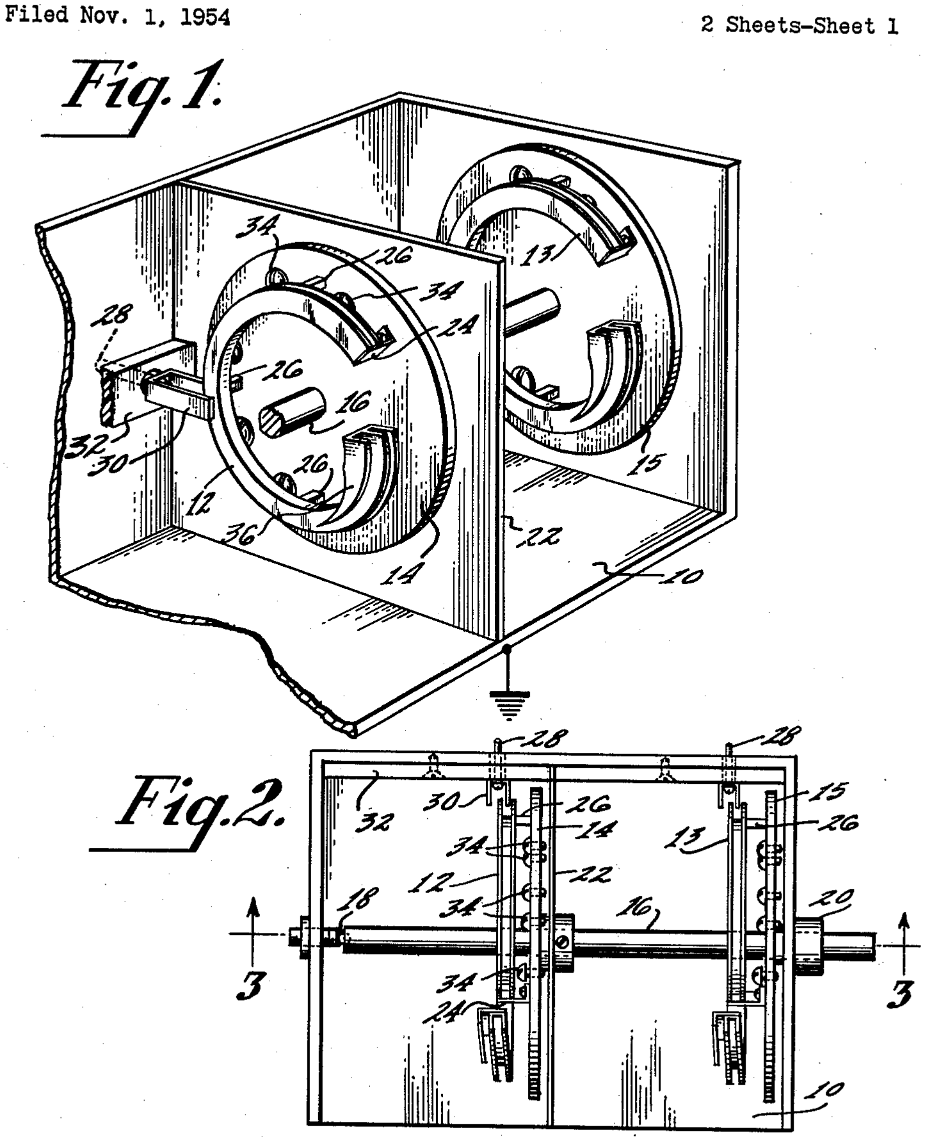
Figure 1 is a perspective view, partly broken away, of a frequency selective circuit structure constructed in accordance with the invention.
Figure 2 is a plan view of the frequency selective circuit structure shown in Figure 1.
Figure 3:
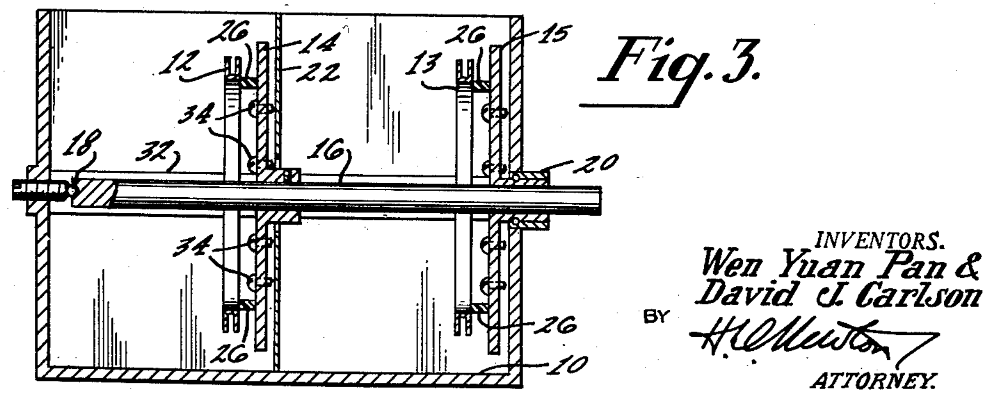
Figure 3 is a sectional view of the frequency selective circuit structure shown in Figure 2 taken on the lines 3—3.

Referring now to the drawings wherein like reference characters are used to designate similar components throughout and particularly to Figures 1, 2, and 3, a frequency selective circuit structure constructed in accordance with the invention is mounted in a conductive chassis 10. The frequency selective circuit structure comprises a pair of unbalanced transmission line sections in adjacent chassis sections which may be connected to form a double tuned filter if desired, or alternatively one section may be connected as a signal selection circuit while the other section provides oscillator tuning. Each of the unbalanced transmission lines has an arcuate conductor 12 and 13. The conductors 12 and 13 are positioned in a plane parallel to and closely adjacent rotatable ground planes 14 and 15 respectively which are constructed of a conductive material to provide a return circuit path for signal frequency currents flowing in the conductors 12 as will hereinafter be explained.

The ground plane 14 is suitably fastened to a conductive shaft 16 which is supported for rotation in the bearings 18 and 20 located in opposite end walls of the tuner chassis 10. The ground plane 14 is affixed to the shaft 16 so as to be physically close to a conductive shielding wall 22 which is conductively connected to the tuner chassis 10 and extends in a plane parallel to the chassis end walls while the ground plane 15 is fastened on the shaft 16 to be positioned in close proximity to one of the chassis end walls.

The resonant transmission line conductors 12 and 13 which, as shown, have U-shaped cross sections, are supported by the rotatable ground planes 14 and 15 respectively in close proximity thereto. One end 24 of the conductor 12 is conductively connected with the ground plane 14 and also serves as a support 12 to maintain conductor 12 in spaced relation to the ground plane 14. Additional supporting elements such as the insulating elements 26 may be provided between the ground plane 14 and the conductor 12, as needed to maintain equal spacing between the ground plane and the conductor throughout the length of the conductor.

A terminal 28 for the tuner is electrically connected with a conductive U-shaped tuning member 30 which is supported by an insulating bracket 32 mounted on the tuner chassis 10. The stationary tuning member 30 is positioned to mesh in spaced relation with the legs of the U-shaped conductor 12 to provide a capacitive circuit connection between the conductor 12 and the tuning member 30. The capacitance between the tuning member 30 and the conductor 12 effectively provides a short circuit connection for signals in the ultra high-frequency range. The frequency of operation of the tuner is substantially determined by the effective length of the conductor 12 between the tuning element 30 and the end 24 of the conductor 12 which is connected to the ground plane. Thus as the shaft 16 is rotated, the conductor 12 is rotated relative to the tuning element 30 to vary the effective length of the conductor 12 between the input terminal and ground, and hence to vary the tuning of the tuner.

The second section of the tuner including the conductor 12 and the ground plane 15 is substantially the same as that described above. However, the configuration or the dimensions of the conductor 13 may be changed slightly, or the line may be shunted with a capacitor so that the transmission line in the second section tunes over a different frequency range from that in the first section. This situation is desirable in the case of a superheterodyne receiver wherein the first section might constitute a signal selection circuit tuned to the frequency of a desired incoming high-frequency signal, and the second section might operate as the frequency determining circuit for the heterodyne or heat frequency oscillator. The oscillator section would be tuned to a frequency differing from the resonant frequency of the first section by an amount equal to the intermediate frequency of the receiving system.

A series of adjustable screws 34 are provided on the ground plane 14 adjacent the conductor 12 to adjust the tracking of the tuner at a plurality of points as it is tuned over the frequency band. The distances between the various screws 34 and the conductor 12 are adjusted to provide control of the distributed capacitance at predetermined points along the line and thereby provides a precise adjustment of the operating frequency at a number of angular positions of the shaft 16. In this manner, the oscillator frequency determining circuit may be made to differ in frequency from the signal selection circuit by a frequency equal to the intermediate frequency over the entire tuning range of the tuner.

The line is also constructed to have a linear relationship between angular deviation of the shaft 16 and the tuned frequency. This is accomplished by adjusting the conductor 12 on the ground plane 14 so that the grounded end 24 is closer to the axis of rotation than the open end. This construction permits smaller capacitance to exist between the conductor 12 and the tuning element 30 at the high-frequency end of the frequency band than exists at the low frequency end of the band. To further supplement this effect, a further capacitor plate 36 is added to the open end of the conductor 12 to provide additional capacitance between the conductor and the tuning element 30 when the conductor 12 is rotated to operate at the low frequency end of the band. The capacitor plate 36 may be shaped so as to provide a varying rate of change of capacitance as the conductor 12 is rotated, thereby enabling strict control of the frequency linearity of the tuner.

In the operation of high-frequency tuners, it is recognized as desirable to raise the unloaded Q of the tuner to as high a value as possible. One reason for this is that the insertion loss of a high-frequency tuned circuit is a function of the ratio of the unloaded Q to loaded Q. Since the circuit loaded Q value is relatively fixed with the design consideration of the apparatus with which the circuit is used, the trend has been to raise the unloaded Q to a high value, preferably toward 1,000 or higher. In a tuner constructed in accordance with the invention, the circulating currents in the resonant transmission line flow from the input terminal 28 through the capacitive tuning element 30 to the conductor 12 and back to the tuner chassis or ground. To get to the tuner chassis from the conductor 12, the signal currents flow from the conductor 12 into the ground plane 14 through the end 24 of the conductor 12. Parallel current paths are provided from the ground plane 14 to the tuner chassis 10 through the shaft 16 and the bearings 18 and 20, and through the low capacitive reactance formed between the ground plane 14 and the shield wall 22.

It can be seen that the contact resistance of the bearings is in series with the conductor 12 and although this is generally very small, taken alone it has appreciable effect on the tuned circuit Q. For example, if the contact resistance were doubled, the Q would be reduced by ½. Since the contact resistance is ordinarily very small, on the order of .01 ohm or the like, it often happens that accumulation of dust or oxidation causes the contact resistance to increase by a relatively large percentage. As explained above, this detrimentally effects the noise figure of the tuner.

In the past, wiping contacts have been provided with a low contact resistance, however, even with these special precautions, the series contact resistance is unpredictable and as with wiping contacts in general, contact noise and spurious responses are introduced into the tuner operation. In accordance with the invention, the provision of the ground plane closely adjacent to an area at ground potential such as a part of the tuner chassis structure, effectively eliminates the contact problems by providing a low impedance shunt path for signal frequency currents through the capacitance between the ground plane and shield wall.

The provision of the rotatable ground plane, in combination with the tunable resonant transmission line, also serves to improve the operation of the tuner in other ways. The transmission line can be more easily constructed to have a uniform characteristic impedance as it is tuned over the frequency band by keeping the distance between the line and the ground plane uniform throughout the entire length of the line. This is often difficult to accomplish with mass production techniques, particularly when as in the present case, the line itself is made rotatable. However, in the tuner of the invention the transmission line conductor 12 is fixed relative to the ground plane and may be constructed and accurately adjusted as a separate unit before insertion into the tuner chassis.

The provision of the rotatable ground plane also enables the construction of a line having a low characteristic impedance, by close spacing between the line and the ground plane. This has a desirable effect of isolating the resonant transmission line so that the effects of surrounding objects in the chassis are minimized. This construction also provides a tuner with low common impedance between adjacent sections, thus: the coupling between the separate selective circuits is more constant; oscillator radiation through the signal circuits and the tuner antenna is less and rejections of undesired responses are more dependable.

Figures 4, 5, 6:
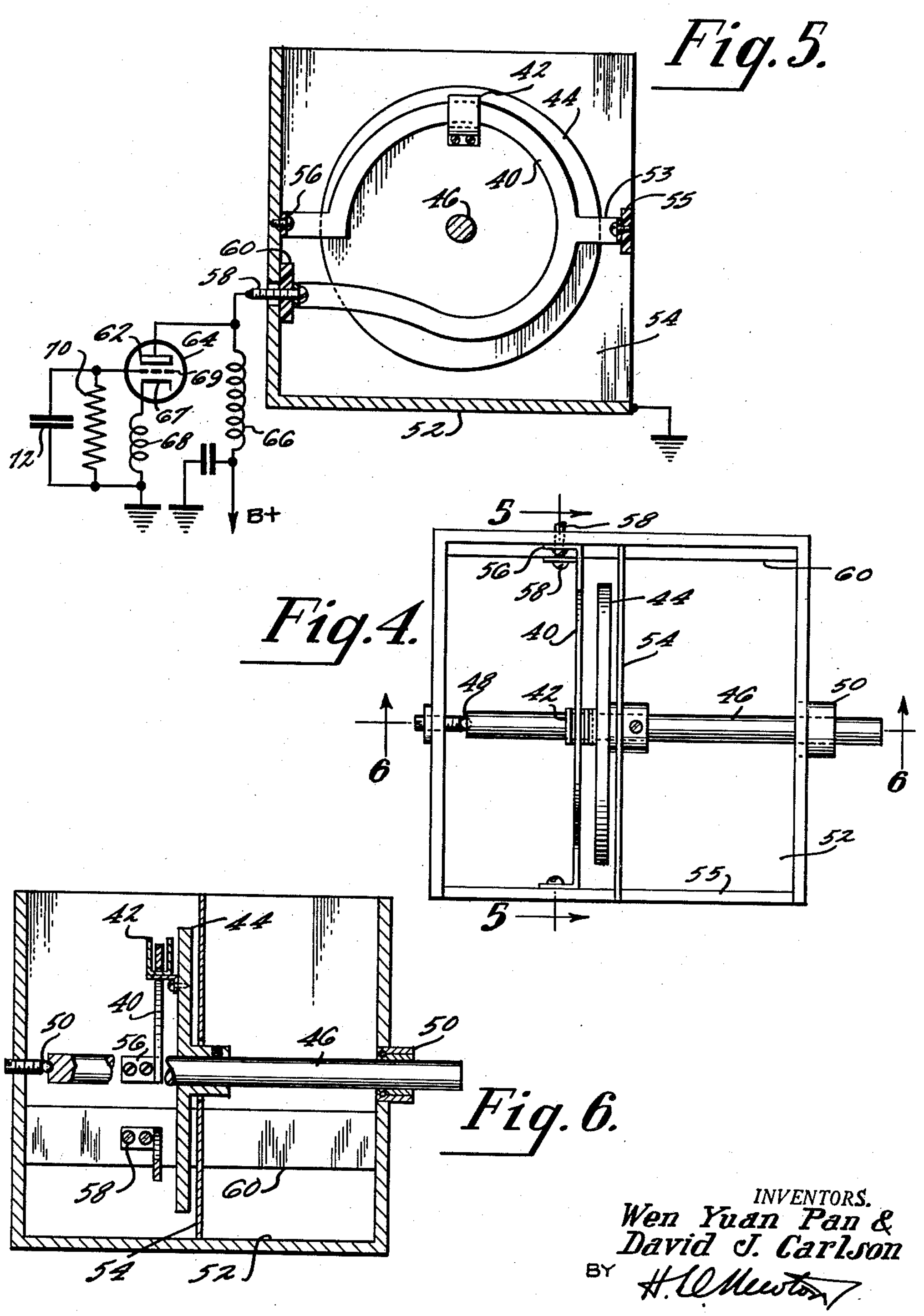
Figure 4 is a plan view of a modification of the high-frequency tuning structure embodying the invention.
Figure 5 is a sectional view of the high-frequency tuning in structure shown in Figure 4 taken on the section lines 5—5, and which forms a part of an ultra high-frequency oscillator structure shown schematically in connection therewith.
Figure 6 is a sectional view of the high-frequency tuning structure shown in Figure 4 taken on the section line 6—6.

Referring now to Figures 4, 5 and 6, the frequency selective circuit structure comprises an unbalanced resonant transmission line having a fixed arcuate conductor 40 and a movable U-shaped capacitive shorting element 42. A capacitive element 42 is conductively attached to a rotatable ground plane 44 which is fastened on a rotatable shaft 46. The shaft 46 is supported for rotation in the bearings 48 and 50 which are located in opposite end walls of the tuner chassis 52.

The rotatable ground plane 44 is positioned closely adjacent a conductive shield wall 54 which is electrically connected with the tuner chassis 52 and is positioned parallel to the chassis end plates. The close spacing of the rotatable ground plane 44 to the shield wall 54 provides a low impedance capacitive connection from the ground plane to the tuner chassis in shunt with the circuit through the bearings 48 and 50.

One end 56 of the conductor 40 is connected with the tuner chassis 52 which is at ground potential and the other end is connected to the input terminal 58 which is mounted on an insulating support 60 in one wall of the tuner chassis 52. A supporting tab 53 on the conductor 40 is insulatingly connected with an insulating bar 55 to provide a support to rigidly hold the conductor in place.

As shown in Figure 5, the input terminal 58 is connected with the anode 62 of an oscillator tube 64. A source of operating potential +B is connected to the anode 62 through a choke coil 66 which coil provides a high impedance to keep the power supply from loading the tank circuit and also to keep the high-frequency signals out of the power supply thus preventing other circuit disturbances. A second radio frequency choke current 68 is provided between the cathode 67 of the tube 64 and ground so that more dependable operation of the oscillator may be achieved as is well known in the art. A grid resistor 70 is connected between the grid 69 and ground to provide a direct current return between the grid and cathode of the grid 64. A capacitor 72 which has low impedance to high-frequency signals is also connected between grid 69 and ground to effectively maintain the grid 69 at the same signal position as tuner chassis 52.

As the shaft 46 is rotated and the capacitive contact member 42 is moved in meshing relation with the conductor 40, the effective length of the conductor between the input terminal 60 and ground is varied, thus providing control of the tuner operational frequency. As described above in connection with Figures 1, 2, and 3, the capacitive tuning element 42 in combination with the electrostatic coupling of the rotatable ground plane 44 to the tuner chassis 52 not only eliminates contact noise and the spurious responses caused by the bearing resistance but enable the construction of a tuner having a high Q. It is obvious that variations and modifications of the tuning structure as described hereinabove could be made such as using transmission line conductors of different configurations without departing from the scope of the invention.

It can be seen, therefor, in accordance with the present invention, an improved frequency selective circuit structure has been provided which is effectively operable over a relatively wide high-frequency range. Undesirable effects of sliding contact members are minimized by the use of capacitive contacts and a rotatable ground plane, thereby providing a tuner having a high degree of stability and reliability. This structure provides a wide range of tuning and is of such simplified character that low oscillator operation tracking and linearity are easily attainable.

What is claimed is:

1. A high frequency tuner structure comprising in combination a conductive chasis, a conductive ground plane element supported for rotation with respect to said conductive chassis, said conductive ground plane element being closely electrically coupled to said chassis to provide a low impedance path to said chassis for high frequency signal currents, a tunable resonant transmission line conductor supported in close proximity to said ground plane element relative to said chassis, a tuning element for said transmission line conductor, and means including said rotatable ground plane element for moving said transmission line conductor and said tuning element relative to each other to vary the effective length of the transmission line conductor and the frequency response of said tuner structure.

2. In a high frequency signal translating system a frequency selective circuit structure comprising in combination, a conductive chassis structure which is at fixed reference potential for said system, tuning means including a resonant transmission line conductor portion positioned adjacent a portion of said chassis structure and an electrical contact portion supported adjacent said transmission line and electrically connected therewith, means providing a conductive ground plane rotatably supported in said chassis structure and positioned between said transmission line conductor and said portion of said chassis structure to provide a low impedance capacitive path to said chassis for high frequency signal currents, one of said tuning means portions being supported by said chassis structure, the other of said tuning means portions being mounted on and electrically connected to said rotatable ground plane means whereby movement of said ground plane effects relative movement between said electrical contact portion and said transmission line conductor portion to vary the effective electrical length of said transmission line conductor to thereby tune said structure to a predetermined high frequency, and a pair of terminals for said selective circuit structure one of which is connected with said chassis structure, and at least a portion of said transmission line conductor being effectively connected between said terminals.

3. A high-frequency tuning system comprising in combination, a conductive chassis structure providing an area of fixed reference potential for said tuning system, a rotatable ground plane element supported by said chassis structure and positioned in a plane parallel to and in close proximity to at least a portion thereof, an arcuate conductor supported on said rotatable ground plane element in a plane parallel thereto to provide therewith a resonant transmission line, means providing an input terminal for said tuner, means for varying the effective length of said transmission line between said input terminal and said chassis including a capacitive contact element connected with said input terminal and mounted on and insulated from said chassis structure and positioned for cooperation with said arcuate conductor as said arcuate conductor is rotated with said ground plane.

4. A high frequency tuner comprising in combination a conductive chassis member, a conductive ground plane member supported for rotation in said conductive chassis member, said conductive ground plane member being closely capacitively coupled to said chassis member to provide a low impedance path between said members for high frequency signal currents, a tunable resonant transmission line structure including an arcuate conductor element and a circuit contact element therefor, said arcuate conductor element positioned in close physical proximity to said ground plane relative to said chassis, one of the elements of said transmission line structure supported by and electrically connected to said rotatable ground plane member, and means for rotating said ground plane member to vary the effective length of the transmission line structure to tune said transmission line structure to a predetermined frequency.

5. A high frequency tuner structure comprising in combination, a conductive chassis, a conductive ground plane element supported for rotation with respect to said conductive chassis, said conductive ground element being closely electrically coupled to said chassis to provide a low impedance path to said chassis for high frequency signal currents, a tunable resonant transmission line conductor fixedly supported in said chassis in close proximity to said ground plane element relative to said chassis, a tuning element for said transmission line conductor supported on said rotatable ground plane element and movable therewith relative to said transmission line conductor to vary the effective length of the transmission line conductor and the frequency response of said tuner structure.

6. In a high frequency signal translating system a frequency selective circuit structure comprising in combination, a conductive chassis structure which is at fixed reference potential for said system, tuning means including a resonant transmission line conductor portion positioned adjacent a portion of said chassis structure and an electrical contact portion supported adjacent said transmission line and electrically connected therewith, means providing a conductive ground plane rotatably supported in said chassis structure and positioned between said transmission line conductor and said portion of said chassis structure to provide a low impedance capacitive path to said chassis for high frequency signal currents, said resonant transmission line conductor portion being supported by said chassis structure, said electrical contact portion being mounted on and electrically connected to said rotatable ground plane means whereby movement of said ground plane effects relative movement between said electrical contact portion and said transmission line conductor portion to vary the effective electrical length of said transmission line conductor to thereby tune said structure to a predetermined high frequency, and a pair of terminals for said selective circuit structure one of which is connected with said chassis structure, and at least a portion of said transmission line conductor being effectively connected between said terminals.

References Cited in the file of this patent

UNITED STATES PATENTS

| | | |
|---|---|---|
| 2,409,449 | Sanders et al. | Oct. 15, 1946 |
| 2,757,344 | Kostriza et al. | July 31, 1956 |